US007664611B2

(12) United States Patent
Luo

(10) Patent No.: US 7,664,611 B2
(45) Date of Patent: Feb. 16, 2010

(54) DEVICE AND METHOD FOR VOLTAGE REGULATOR WITH LOW STANDBY CURRENT

(75) Inventor: Wenzhe Luo, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 55 days.

(21) Appl. No.: 11/950,209

(22) Filed: Dec. 4, 2007

(65) Prior Publication Data

US 2008/0116863 A1 May 22, 2008

Related U.S. Application Data

(63) Continuation of application No. 11/565,542, filed on Nov. 30, 2006, now Pat. No. 7,353,124, which is a continuation of application No. 11/061,062, filed on Feb. 17, 2005, now Pat. No. 7,162,380.

(30) Foreign Application Priority Data

Sep. 16, 2004 (CN) ........................ 2004 1 0066516

(51) Int. Cl.
*G01R 27/00* (2006.01)

(52) U.S. Cl. ........................................................ 702/64

(58) Field of Classification Search .................... 702/64
See application file for complete search history.

(56) References Cited

U.S. PATENT DOCUMENTS

| | | | | |
|---|---|---|---|---|
| 5,648,759 | A | 7/1997 | Miller et al. | |
| 5,671,149 | A | 9/1997 | Brown | |
| 6,118,265 | A * | 9/2000 | Larsen et al. | 323/316 |
| 7,162,380 | B2 | 1/2007 | Luo | |
| 7,353,124 | B2 | 4/2008 | Luo | |
| 2003/0151450 | A1 * | 8/2003 | Nguyen et al. | 327/540 |

* cited by examiner

*Primary Examiner*—Bryan Bui
*Assistant Examiner*—Jonathan Teixeira Moffat
(74) *Attorney, Agent, or Firm*—Townsend and Townsend and Crew LLP

(57) ABSTRACT

An apparatus and method for providing a reference voltage for regulating voltage levels. The apparatus includes a first voltage generation system for receiving a first control signal and output a calibration voltage, a voltage adjustment system for receiving the calibration voltage and a reference voltage and output a second control signal, and a second voltage generation system for receiving the second control signal and output the reference voltage. The voltage adjustment system includes a latch system for receiving a third control signal and a fourth control signal and output the first control signal.

10 Claims, 3 Drawing Sheets

PRIOR ART

DEVICE AND METHOD FOR VOLTAGE REGULATOR WITH LOW STANDBY CURRENT

CROSS-REFERENCES TO RELATED APPLICATIONS

This application claims priority to Chinese Patent Application No. 200410066516.2, filed Sep. 16, 2004, commonly assigned and incorporated by reference herein for all purposes.

The following three commonly-owned co-pending applications, including this one, are being filed concurrently and the other two are hereby incorporated by reference in their entirety for all purposes:

1. U.S. patent application Ser. No. 11/565,542, in the name of Wenzhe Luo, titled, "Device and Method for Voltage Regulator with Low Standby Current,";
2. U.S. patent application Ser. No. 11/061,062, in the name of Wenzhe Luo, titled, "Device and Method for Voltage Regulator with Low Standby Current,";
3. U.S. patent application Ser. No. 11/060,922, in the name of Wenzhe Luo, titled, "Device and Method for Voltage Regulator with Stable and Fast Response and Low Standby Current,"; and
4. U.S. patent application Ser. No. 11/061,197, in the name of Wenzhe Luo and Paul Ouyang, titled, "Device and Method for Low-Power Fast-Response Voltage Regulator with Improved Power Supply Range,".

BACKGROUND OF THE INVENTION

The present invention is directed to integrated circuits. More particularly, the invention provides a device and method for voltage regulator with low standby current. Merely by way of example, the invention has been applied to a battery powered system. But it would be recognized that the invention has a much broader range of applicability.

The voltage regulator is widely used and integrated onto an integrated circuit chip. The integrated circuit chip may contain numerous transistors with shrinking size. The decrease in transistor size usually requires lowering the working voltage of the transistors. Hence the power supply voltage for the integrated circuit chip decreases with shrinking transistor size. The integrated circuit chip usually serves as a system component. The system also contains other subsystems whose working voltages may be higher than the working voltage of the transistors. Hence the power supply voltage for the system may be higher than that for the integrated circuit chip. For example, the system power supply equals 5 volts, and the chip power supply equals 3.3 volts. In another example, the system power supply equals 3.3 volts, and the chip power supply equals 1.8 volts.

To provide the chip power supply, the system power supply is usually converted by a voltage regulator. For example, the voltage regulator receives a 5-volt signal and generates a 3.3-volt signal. In another example, the voltage regulator receives a 3.3-volt signal and generates a 1.8-volt signal. FIG. 1 is a simplified diagram for voltage regulator. A voltage regulator 100 includes a reference voltage generator 110, an operational amplifier 120, and a voltage divider 130. The voltage generator 110 generates a reference voltage $V_{ref}$ 112. The $V_{ref}$ 112 is received by the operational amplifier 120. The operational amplifier 120 also receives an system power supply $V_{system}$ 124 and generates an output voltage $V_{out}$ 122. The $V_{out}$ 122 is divided by the voltage 130 and the feedback voltage $V_{feedback}$ 132 is received by the operational amplifier.

The $V_{out}$ 122 is used as the chip power supply. For example, the system power supply is 5 volts, and the desired chip power supply is 3.3 volts. If the $V_{ref}$ 112 equals 1.25 volts, the voltage divider 130 sets $V_{feedback}$ 132 to be equal to (1.25/3.3) $V_{out}$. In another example, the $V_{ref}$ 112 equals the desired chip power supply. Then the $V_{out}$ 122 is used directly as the $V_{feedback}$ 132 with the voltage divider 130 removed.

The voltage regulator usually provides the chip power supply when the system is in the active mode or the standby mode. The current of the voltage regulator in the standby mode consumes important energy. For example, the operating current of the voltage regulator ranges from 30 to 200 μA. The energy consumption in the standby mode limits the operation time of battery-powered devices. Further, some battery-powered devices require low standby power consumption and cannot rely on the regulator that consumes significant power in the standby mode. Consequently, these battery-powered devices usually cannot take advantage of the shrinking transistor size.

From the above, it is seen that an improved technique for voltage regulator is desired.

BRIEF SUMMARY OF THE INVENTION

The present invention is directed to integrated circuits. More particularly, the invention provides a device and method for voltage regulator with low standby current. Merely by way of example, the invention has been applied to a battery powered system. But it would be recognized that the invention has a much broader range of applicability.

In a specific embodiment, the invention provides an apparatus for providing a reference voltage for regulating voltage levels. The apparatus includes a first voltage generation system configured to receive a first control signal and output a calibration voltage, a voltage adjustment system configured to receive the calibration voltage and a reference voltage and output a second control signal, and a second voltage generation system configured to receive the second control signal and output the reference voltage. The voltage adjustment system includes a latch system configured to receive a third control signal and a fourth control signal and output the first control signal. The first control signal is associated with a first state if the third control signal is associated with a calibration and the fourth control signal is free from being associated with a completion of a voltage adjustment by the voltage adjustment system. The first control signal is associated with a second state if the third control signal is free from being associated with the calibration or the fourth control signal is associated with the completion of the voltage adjustment by the voltage adjustment system. The first state is associated with an active state of the first voltage generation system and the second state is associated with an inactive state of the first voltage generation system. The voltage adjustment system is configured to process information associated with the calibration voltage and a reference voltage and determine the second control signal based on at least information associated with the calibration voltage and the reference voltage. The second voltage generation system includes a first transistor configured to receive the second control signal, a second transistor configured to receive the second control signal, a first resistor in parallel with the first transistor, a second resistor in parallel with the second transistor, and a third transistor coupled to the second resistor and the second transistor and configured to generate the reference voltage. The second control signal is associated with an active state or an inactive state of the first transistor and is associated with an active state or an inactive state of the second transistor.

According to another embodiment of the present invention, a method for providing a reference voltage for regulating voltage levels includes receiving a first control signal. The first control signal is associated with a calibration or free from being associated with the calibration. Additionally, the method includes processing information associated with the first control signal, and generating a second control signal based on at least information associated with the first control signal. The second control signal is associated with an active state of a first voltage generation system or an inactive state of the first voltage generation system. Moreover, the method includes if the second control signal is associated with the inactive state of the first voltage generation system, deactivating the first voltage generation system and a voltage adjustment system coupled to the first voltage generation system, and if the second control signal is associated with the active state of the first voltage generation system, performing a calibration process. The calibration process includes activating the first voltage generation system and the voltage adjustment system. The voltage adjustment system includes a latch system. Additionally, the calibration process includes generating a calibration voltage in response to the second control signal, processing information associated with the calibration voltage and a reference voltage, generating a third control signal based on at least information associated with the calibration voltage and the reference voltage, processing information associated with the third control signal, and generating the reference voltage based on at least information associated with the third control signal. Moreover, the calibration process includes generating a fourth control signal associated with a completion of the calibration process, and deactivating the first voltage generation system and the voltage adjustment system.

According to yet another embodiment of the present invention, an apparatus for providing a reference voltage for regulating voltage levels includes a first voltage generation system configured to receive a first control signal and output a calibration voltage, a voltage adjustment system configured to receive the calibration voltage and a reference voltage and output a second control signal, and a second voltage generation system configured to receive the second control signal and output the reference voltage. The voltage adjustment system includes a latch system configured to receive a third control signal and a fourth control signal and output the first control signal. The first control signal is associated with a first state if the third control signal is associated with a calibration and the fourth control signal is free from being associated with a completion of a voltage adjustment by the voltage adjustment system. The first control signal is associated with a second state if the third control signal is free from being associated with the calibration or the fourth control signal is associated with the completion of the voltage adjustment by the voltage adjustment system. The first state is associated with an active state of the first voltage generation system and the second state is associated with an inactive state of the first voltage generation system. The voltage adjustment system is configured to process information associated with the calibration voltage and a reference voltage and determine the second control signal based on at least information associated with the calibration voltage and the reference voltage. The second voltage generation system includes a first transistor configured to receive the second control signal, a second transistor configured to receive the second control signal, a first resistor in parallel with the first transistor, a second resistor in parallel with the second transistor, and a third transistor coupled to the second resistor and the second transistor and configured to generate the reference voltage. The second control signal is associated with an "on" state or an "off" state of the first transistor and is associated with an "on" state or an "off" state of the second transistor. The first resistor is substantially shorted by the first transistor if the second signal is associated with an active state of the first transistor.

Many benefits are achieved by way of the present invention over conventional techniques. Certain embodiments of the present invention improve accuracy of the reference voltage. The reference voltage is substantially equal to the band-gap voltage. Some embodiments of the present invention significantly reduce the power consumption of the voltage regulator in the standby mode. In the standby mode, the band-gap circuit and certain other components are either turned off or inactivated. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits. More particularly, the invention provides a device and method for voltage regulator with low standby current. Merely by way of example, the invention has been applied to a battery powered system. But it would be recognized that the invention has a much broader range of applicability.

Figure 1:
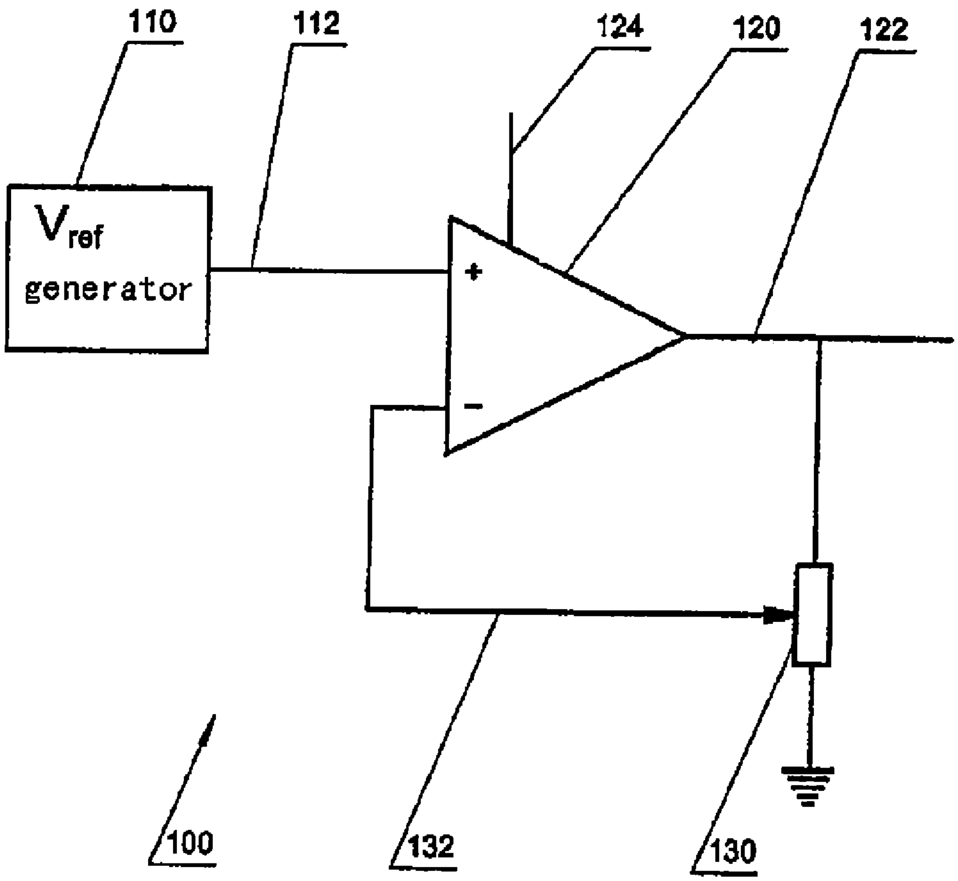
FIG. 1 is a simplified diagram for voltage regulator.
Figure 2:
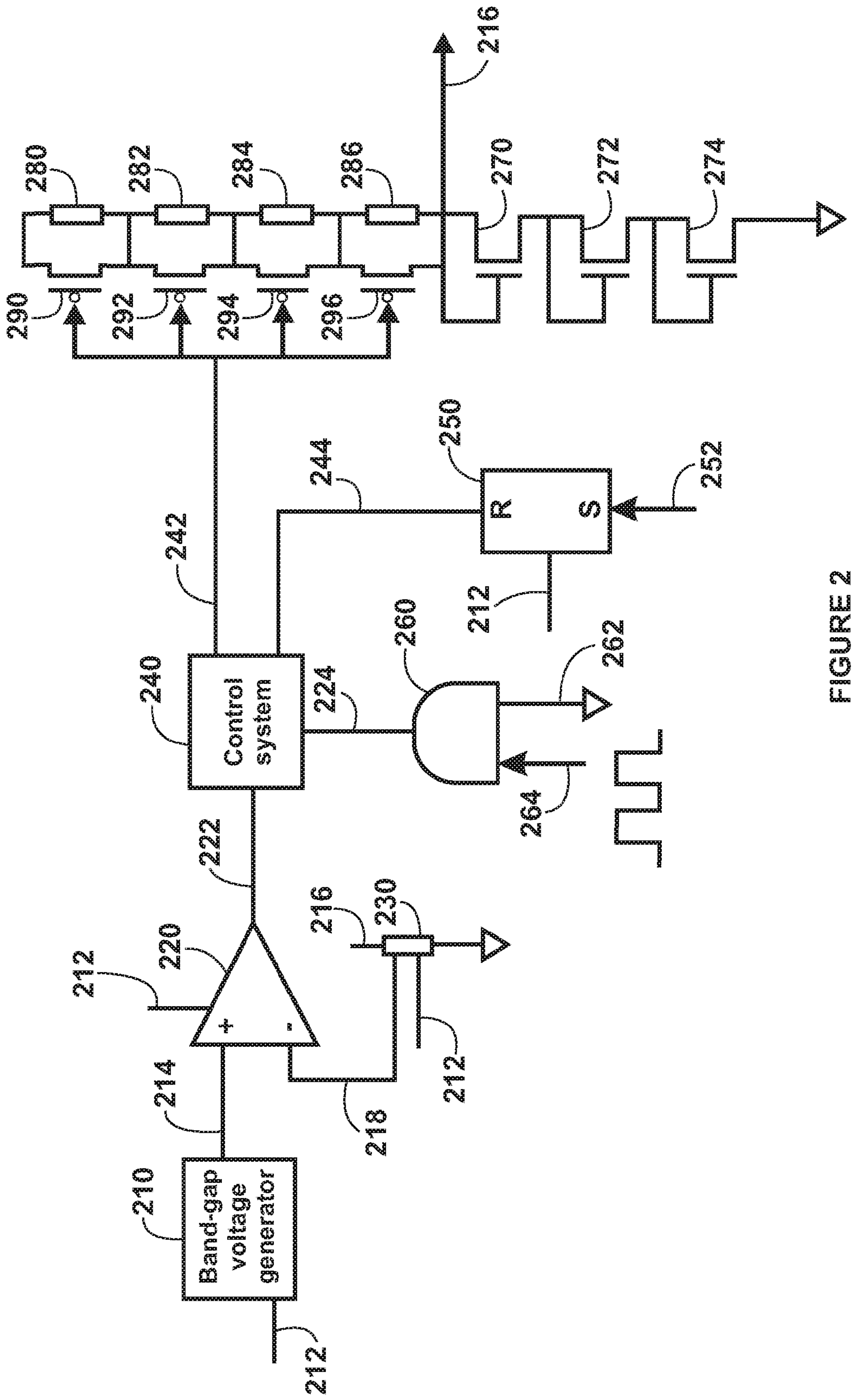
FIG. 2 is a simplified reference voltage generator for voltage regulator according to an embodiment of the present invention.

FIG. 2 is a simplified reference voltage generator for voltage regulator according to an embodiment of the present invention. This diagram is merely an example, which should not unduly limit the scope of the claims herein. The device 200 includes the following components:

1. Band-gap voltage generator 210;
2. Comparator 220;
3. Voltage divider 230;
4. Control system 240;
5. Latch 250;
6. Clock gate 260;
7. Transistors 270, 272, 274, 290, 292, 294, and 296;
8. Resistors 280, 282, 284 and 286.

The above electronic devices provide components for a reference voltage generator of a voltage regulator according to an embodiment of the present invention. For example, the reference voltage generator 200 serves as the reference voltage generator 110 for the voltage regulator 100. Other alternatives can also be provided where certain devices are added, one or more devices are removed, or one or more devices are arranged with different connections sequence without departing from the scope of the claims herein. For example, the number of the resistors and the number of the transistors in parallel with the resistors may each equal $2^m$ or other value. m is a positive integer. In another example, one or two of the transistors 270, 272 and 274 may be removed, or one or more additional transistors may be added. Future details of the present invention can be found throughout the present specification and more particularly below.

The band-gap voltage generator 210 receives a control signal 212. When the control signal 212 does not represent enablement, the band-gap voltage generator 210 is turned off. When the control signal 212 represents enablement, the band-gap voltage generator 210 outputs a calibration voltage 214. For example, the calibration voltage 214 equals 1.25 volts. The operation current of the band-gap voltage generator 210 ranges from 5 μA to 200 μA. The voltage divider 230 receives a reference voltage 216 and the control signal 212. When the control signal 212 does not represent enablement, the voltage divider 230 is turned off. When the control signal 212 represents enablement, the voltage divider 230 outputs a divided reference voltage 218. The divided reference voltage 218 is proportional to the reference voltage 216. For example, the desired reference voltage 216 is 3.3 volts and the calibration voltage 214 is 1.25 volts. The proportionality constant equals 1.25/3.3.

The divided reference voltage 218 is received by the comparator 220. The comparator 220 also receive the control signal 212. When the control signal 212 does not represent enablement, the comparator 220 is turned off. When the control signal 212 represents enablement, the comparator 220 receives the calibration voltage 214. In response, the comparator outputs a comparison signal 222. The comparison signal 222 represents whether the divided reference voltage 218 is larger than, equal to, or smaller than the calibration voltage 214.

The comparison signal 222 is received by the control system 240 if the control system is in active mode. The control system 240 also receives a gated clock signal 224 and outputs a control signal 242. For example, the control signal 242 are carried by four control bit lines. The control signal 242 is received by the transistors 290, 292, 294 and 296. The transistors 290, 292, 294 and 296 affects the reference voltage 216, the divided reference voltage 218, and the comparison signal 222. The control system 240 uses the Successive Approximation Register (SAR) logic to process the comparison signal 222 and determine the control signal 242. For example, the SAR logic uses a negative feedback process. The feedback process is performed according to the beating of the gated clock signal 224. The control signal 242 adjusts the reference voltage 216 through the transistors 290, 292, 294 and 296, and reduces the difference between the divided voltage signal 218 and the calibration voltage 214. For example, at the beginning of the SAR logic process, half of the total resistance related to the resistors 280, 282, 284 and 286 are shorted. In another example, the control system 240 uses an algorithm other than the SAR logic to process the comparison signal 222 and determine the control signal 242.

After the difference between the divided voltage signal 218 and the calibration voltage 214 is minimized, the control system 240 stores the control signal 242 and switches into inactive mode. Also, the control system 240 outputs a status signal 244 representing the completion of the SAR logic process. The status signal 244 representing the completion of the SAR logic process is received by the latch 250, which in turn outputs the control signal 212 representing lack of enablement. If the latch 250 receives the status signal 244 not representing the completion of the SAR logic process, the control signal 212 depends on a status signal 252. If the status signal 252 represents calibration, the control signal 212 represents enablement; otherwise the control signal 212 represents lack of enablement. The calibration may be performed when the integrated circuit chip is powered on, when the integrated circuit chip switches to an active mode, or at some other times. For example, the control signal 212 corresponding to "0" represents lack of enablement, and the control signal corresponding to "1" represents enablement.

The clock gate 260 receives a control signal 262 and a clock signal 264 and outputs the gated clock signal 224. The control signal 262 is a delayed version of the control signal 212. If the control signal 262 represents enablement, the gated clock signal 224 is substantially the same as the clock signal 264. If the control signal 262 does not represent enablement, the clock gate is turned off. The gated clock signal 224 instructs the control system 240 not to perform the SAR logic process. For example, the gated clock signal 224 keeps the control system 240 in the inactive mode.

The transistors 290, 292, 294 and 296 are used to short the resistors 280, 282, 284 and 286 respectively if such instructions are received from the control signal 242. For example, the transistors 290, 292, 294 and 296 are PMOS transistors. The resistors 280, 282, 284 and 286 may have the same or different resistances. For example, the resistances each range from 500 KOhm to 5 MOhm. In another example, the resistors 280, 282, 284 and 286 can be replaced by MOS transistors of equivalent resistance. The transistors 270, 272 and 274 in combination with other components generate the reference voltage 216. For example, the transistors 270, 272 and 274 are NMOS transistors, and the reference voltage can be determined as follows.

$$V_{ref}=V_{tn1}+V_{tn2}+V_{tn3}+V_{od1}+V_{od2}+V_{od3} \quad \text{(Equation 1)}$$

$$V_{od1}+V_{od2}+V_{od3}=K\times I_{bias}^{0.5} \quad \text{(Equation 2)}$$

wherein $V_{tn1}$, $V_{tn2}$, and $V_{tn3}$ are threshold voltages for the transistors 270, 272 and 274 respectively. For example, $V_{tn1}$, $V_{tn2}$, and $V_{tn3}$ each equal 0.7 volt. $V_{od1}$, $V_{od2}$ and $V_{od3}$ are the overdrive voltages for the transistors 270, 272 and 274 respectively. $I_{bias}$ is the bias current flowing through the transistors 270, 272 and 274. K is a constant depending on certain characteristics of the transistors 270, 272 and 274. For example, the characteristics include electron mobility, gate oxide unit capacitance, and ratio of transistor width to transistor length.

Figure 3:
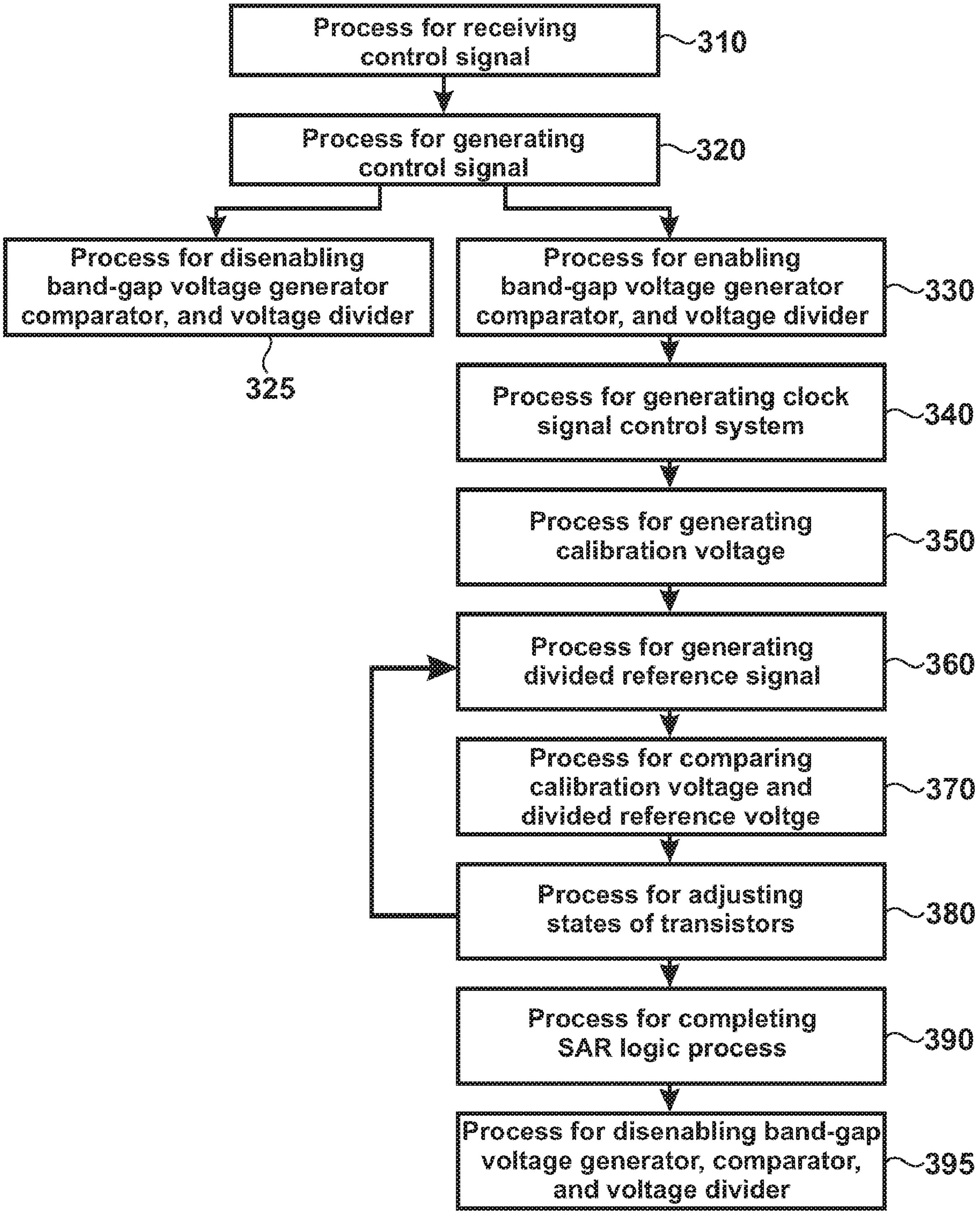
FIG. 3 is a simplified method for generating a reference voltage for regulating voltage levels according to an embodiment of the present invention.

FIG. 3 is a simplified method for generating a reference voltage for regulating voltage levels according to an embodiment of the present invention. This diagram is merely an example, which should not unduly limit the scope of the claims herein. The method 300 includes the following processes:

1. Process 310 for receiving control signal 252;
2. Process 320 for generating control signal 212;
3. Process 325 for disenabling band-gap voltage generator 210, comparator 220, and voltage divider 230.
4. Process 330 for enabling band-gap voltage generator 210, comparator 220, and voltage divider 230;
5. Process 340 for generating gated clock signal 224 to control system 240;
6. Process 350 for generating calibration voltage 214;
7. Process 360 for generating divided reference signal 218;
8. Process 370 for comparing calibration voltage 214 and divided reference voltage 218;
9. Process 380 for adjusting states of transistors 290, 292, 294 and 296;
10. Process 390 for completing SAR logic process;
11. Process 395 for disenabling band-gap voltage generator 210, comparator 220, and voltage divider 230.

The above sequence of processes provides a method according to an embodiment of the present invention. Other alternatives can also be provided where processes are added, one or more processes are removed, or one or more processes are provided in a different sequence without departing from the scope of the claims herein. Future details of the present invention can be found throughout the present specification and more particularly below.

At the process 310, the control signal 252 is received by the latch 250. The control signal 252 may represent calibration or others. At the process 320, the control signal 250 is generated. The latch 250 also receives the status signal 244 representing either the completion of the SAR logic process or else. If the latch 250 receives the status signal 244 not representing the completion of the SAR logic process, the control signal 212 depends on a status signal 252. If the status signal 252 represents calibration, the control signal 212 represents enablement and the process 330 is performed. For example, the status signal 252 represents calibration when the integrated circuit chip is powered on, when the integrated circuit chip switches to an active mode, or at some other times. If the status signal 252 does not represent calibration, the control signal 212 represents lack of enablement and the process 325 is performed.

At the process 325, the control signal 212 representing lack of enablement is received by the band-gap voltage generator 210, the comparator 220, and the voltage divider 230. The control signal disenables, e.g., turns off, the band-gap voltage generator 210, the comparator 220, and the voltage divider 230.

At the process 330, the control signal 212 representing enablement is received by the band-gap voltage generator 210, the comparator 220, and the voltage divider 230. The control signal enables, e.g., turns on, the band-gap voltage generator 210, the comparator 220, and the voltage divider 230. At the process 340, the gated clock signal 224 is output to control system 240 by the clock gate 260. The clock gate receives the control signal 262 and the clock signal 264. The control signal 262 is a delayed version of the control signal 212. If the control signal 262 represents enablement, the gated clock signal 224 is substantially the same as the clock signal 264. If the control signal 262 does not represent enablement, the clock gate is turned off.

At the process 350, the calibration voltage 214 is generated by the enabled band-gap voltage generator 210. For example, the calibration voltage 214 equals 1.25 volts. At the process 360, the divided reference signal 218 is generated by the enabled voltage divider 230. The enabled voltage divider 230 receives the reference voltage 216 and the control signal 212 and outputs a divided reference voltage 218. The divided reference voltage 218 is proportional to the reference voltage 216. For example, the proportionality constant equals 1.25/3.3.

At the process 370, the calibration voltage 214 and the divided reference voltage 218 are compared by the enabled comparator 220. The comparator 220 outputs a comparison signal 222, representing whether the divided reference voltage 218 is larger than, equal to, or smaller than the calibration voltage 214.

At the process 380, the states of transistors 290, 292, 294 and 296 is adjusted by the control system 240 in active mode. The control system 240 receives the comparison signal 222 and the gated clock signal 224 and outputs the control signal 242. For example, the control signal 242 are carried by four control bit lines. The control signal 242 is received by the transistors 290, 292, 294 and 296. The transistors 290, 292, 294 and 296 affects the reference voltage 216, the divided reference voltage 218, and the comparison signal 222. The control system 240 uses the Successive Approximation Register (SAR) logic to process the comparison signal 222 and determine the control signal 242. For example, the SAR logic uses a negative feedback process. The feedback process is performed according to the beating of the gated clock signal 224. The control signal 242 adjusts the reference voltage 216 through the transistors 290, 292, 294 and 296, and reduces the difference between the divided voltage signal 218 and the calibration voltage 214. In other words, the process 360 for generating divided reference signal 218, the process 370 for comparing calibration voltage 214 and divided reference voltage 218, and the process 380 for adjusting states of transistors 290, 292, 294 and 296 are repeated until the SAR logic process is completed. For example, at the beginning of the SAR logic process, half of the total resistance related to the resistors 280, 282, 284 and 286 are shorted. In another example, if the divided voltage signal 218 is larger than the calibration voltage 214, the shorted resistance related to the resistors 280, 282, 284 and 286 is reduced. Therefore Ibias is increased. If the divided voltage signal 218 is smaller than the calibration voltage 214, the shorted resistance related to the resistors 280, 282, 284 and 286 is increased. Therefore Ibias is reduced.

At the process 390, the SAR logic process is completed when the difference between the divided voltage signal 218 and the calibration voltage 214 is minimized. The control system 240 stores the control signal 242 and switches into inactive mode. Also, the control system 240 outputs a status signal 244 representing the completion of the SAR logic process. The status signal 244 representing the completion of the SAR logic process is received by the latch 250, which in turn outputs the control signal 212 representing lack of enablement. For example, the control signal 212 corresponding to "0" represents lack of enablement, and the control signal corresponding to "1" represents enablement.

At the process 395, the control signal 212 representing lack of enablement is received by the band-gap voltage generator 210, the comparator 220, and the voltage divider 230. The control signal disenables, e.g., turns off, the band-gap voltage generator 210, the comparator 220, and the voltage divider 230.

The present invention has various advantages. Certain embodiments of the present invention improve accuracy of the reference voltage. The reference voltage is substantially equal to the band-gap voltage. Some embodiments of the present invention significantly reduce the power consumption of the voltage regulator in the standby mode. In the standby mode, the band-gap circuit and certain other components are either turned off or inactivated. For example, the standby current is approximately equal to ($V_{dd}$-$V_{tn1}$-$V_{tn2}$-$V_{tn3}$-$V_{od1}$-$V_{od2}$-$V_{od3}$) divided by the un-shorted resistance related to the resistors 280, 282, 284, and 286. $V_{tn1}$, $V_{tn2}$, and $V_{tn3}$ represent the threshold voltages of the NMOS transistors 270, 272, and 274 respectively. $V_{od1}$, $V_{od2}$, and $V_{od3}$ represent the overdriving voltages of the NMOS transistor 270, 272, and 274 respectively.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A system for regulating voltage levels, the system comprising:

a voltage source being configured to provide a first reference voltage;

a first voltage adjustment module being configured to receive an input voltage, the voltage adjust module being adapted to output a calibration voltage;

a second voltage adjustment module being configured to output a second reference voltage, the second reference voltage being proportional to the calibration voltage at a predetermined ratio;

a voltage comparison module being configured to receive the second reference voltage and the calibration voltage, the voltage comparison module being configured to output a first signal based on a voltage difference between the second reference voltage and the calibration voltage;

a clock module being configured to provide a clock signal;

a control module being configured to receive the first signal and the clock signal, the control module including a logic unit for generating a second signal based at least on the first signal and the clock signal; and a third voltage adjustment module being configured to receive at least the second signal, the third voltage adjustment module including one or more transistors, the third voltage adjustment modeling being configured minimize the voltage difference using the second signal, the third voltage adjustment further being configured to generate a third signal, the third signal being used for regulating voltage levels.

2. The system of claim 1 wherein the logic unit includes a successive approximation register.

3. The system of claim 2 wherein the logic unit performs a negative feedback process based at least on the clock signal.

4. A method for regulating voltage levels, the method comprising:

providing a first reference voltage and a calibration voltage;

generating a second reference voltage, the second reference voltage being proportional to the calibration voltage at a predetermined ratio;

comparing the calibration voltage and the second reference voltage;

determining a voltage difference between the calibration voltage and the second reference voltage;

generating a first control signal based at least on the difference;

processing the first control signal using a logic unit;

generating a second control signal using the logic unit, processing the second control signal by a voltage adjustment module, the voltage adjustment module including one or more transistors; and generating a third control signal, the third signal being used for regulating voltage levels.

5. The method of claim 4 further comprising storing the first control signal.

6. The method of claim 4 further comprising performing a negative feedback process by the logic unit.

7. The method of claim 4 further comprising minimizing the voltage difference by the voltage adjustment module.

8. The method of claim 4 further comprising providing a clock signal.

9. The method of claim 8 wherein the logic unit includes a successive approximate register module.

10. The method of claim 9 wherein logic unit is synchronized to the clock signal.

* * * * *